United States Patent
Hoogers

(10) Patent No.: US 7,284,934 B2
(45) Date of Patent: Oct. 23, 2007

(54) METHOD FOR SUPPLYING A COMPONENT AND A COMPONENT SUPPLYING DEVICE

(75) Inventor: Hubert Francijn Maria Hoogers, Wintelre (NL)

(73) Assignee: Assembleon N.V., Eindhoven (NL)

( * ) Notice: Subject to any disclaimer, the term of this patent is extended or adjusted under 35 U.S.C. 154(b) by 0 days.

(21) Appl. No.: 11/414,545

(22) Filed: May 1, 2006

(65) Prior Publication Data
US 2006/0280564 A1   Dec. 14, 2006

(30) Foreign Application Priority Data
May 23, 2005   (NL)   ..................... 1029098

(51) Int. Cl.
*B65G 51/30*   (2006.01)
(52) U.S. Cl. ............... 406/176; 406/83; 406/137; 406/197; 221/278
(58) Field of Classification Search ............... 221/278; 414/676; 406/83, 88, 89, 137, 138, 176, 406/177, 178, 179, 180, 197
See application file for complete search history.

(56) References Cited

U.S. PATENT DOCUMENTS

| | | | | |
|---|---|---|---|---|
| 3,062,414 A | * | 11/1962 | Morris | 406/90 |
| 3,892,333 A | * | 7/1975 | Best et al. | 221/200 |
| 3,985,263 A | * | 10/1976 | Rohrbach et al. | 221/1 |
| 4,801,044 A | * | 1/1989 | Kubota et al. | 221/163 |
| 5,570,812 A | * | 11/1996 | Ando et al. | 221/233 |
| 5,853,108 A | * | 12/1998 | Ando et al. | 221/163 |
| 6,041,964 A | * | 3/2000 | Tokarz et al. | 221/211 |
| 6,390,736 B2 | * | 5/2002 | Rassman et al. | 406/180 |
| 6,752,291 B2 | * | 6/2004 | Saito | 221/278 |

FOREIGN PATENT DOCUMENTS

EP   0 684 757 A1   11/1995

* cited by examiner

*Primary Examiner*—Joe Dillon, Jr.
(74) *Attorney, Agent, or Firm*—Foley & Lardner LLP

(57) ABSTRACT

A method is provided for supplying a component to a pick-up position located near a stop by means of a component supplying device. The component supplying device includes a guide provided with the stop, at least one air inlet connected to the guide, and at least one air outlet also connected to the guide. Components are carried through the guide in a transport direction towards the stop by means of air supplied through the air inlet. Once a number of components have been transported in the transport direction, the air outlet is substantially closed by at least one component present in the row. Subsequently, at least one component following the row is transported in a non-transport direction.

17 Claims, 2 Drawing Sheets

METHOD FOR SUPPLYING A COMPONENT AND A COMPONENT SUPPLYING DEVICE

CROSS-REFERENCE TO RELATED APPLICATIONS

This application claims priority to, and hereby incorporates by reference in its entirety, The Netherlands Patent Application No. 1029098, which was filed on May 23, 2005.

BACKGROUND

The invention relates to a method for supplying a component to a pick-up position. The invention also relates to a component supplying device. One such method and device are disclosed in European Patent Application No. EP-A1-0 684 757, which teaches components contained in a cassette that is connected to a component supplying device. The components are carried from the cassette via a component carrier of a guide to a pick-up position located near a stop (e.g., a wall provided at the end of the guide). At the pick-up position, a component is typically picked-up by means of a pick-up unit and placed on a substrate.

In many cases, components are also transported from the cassette into the guide under the influence of the force of gravity. The forces exerted on the components in the guide by the air and possibly by the force of gravity cause the component that is located nearest the stop to be compressed firmly between the stop and the next component. As a result, when picking-up the component, a relatively large force must be exerted on the compressed component to pull the component from its position between the stop and the next component.

What is needed, therefore, is an apparatus and a methodology that address at least one if not more of the deficiencies that afflict conventional practice, as previously described. For example, an object of the invention is to provide a method and an apparatus by which components may be: (a) moved to a pick-up position in a reliable manner; and (b) picked-up at the pick-up position relatively easily.

SUMMARY

An embodiment of the present invention addresses a method of supplying components. This method includes, among other possible steps: (a) providing a component supplying device that includes, among other possible things: (i) a guide having a stop adjacent a pick-up position; (ii) at least one air inlet in fluid communication with the guide; and (iii) at least one air outlet in fluid communication with the guide; (b) supplying air to the guide by means of the at least one air inlet; (c) moving a plurality of components via the guide in a transport direction toward the pick-up position by means of the air supplied to the guide; (d) closing substantially at least one of the air outlets with one or more of the components moved in the transport direction toward the pick-up position; and then (e) moving a component in a non-transport direction by means of the air supplied to the guide.

In a further embodiment of this method, the components may be moved in the transport direction in a row. Further, one of the air outlets may be closed by the component at an end of the row away from the stop.

In another further embodiment of this method, the method may also include the step of: removing the component nearest the stop.

In another further embodiment of this method, the method may also include the step of: moving the remaining components in the transport direction toward the pick-up position such that at least one of the air outlets is reopened.

In another further embodiment of this method, the method may also include the step of: moving, in the transport direction, by means of the air supplied to the guide the component that was previously moved in the non-transport direction.

Another embodiment of the present invention addresses a component supplying device. The component supplying devices includes, among other possible things a guide, a component supply cassette, at least one air inlet, and at least one air outlet. The guide includes, among other possible things, a stop adjacent a pick-up position and a component carrier. Each of the air inlets and air outlets is in fluid communication with the component carrier. The component supply device is configured such that: (a) when air is supplied to the component carrier by means of the at least one air inlet, the components move in a transport direction from the cassette toward the pick-up position; (b) when a sufficient number of components have been moved by the air in the transport direction, the air outlets are substantially closed by the components, thereby forcing an additional component to be moved, in a non-transport direction, by air supplied to the component carrier by means of the at least one air inlet.

In a further embodiment of this component supply device, the component supply device may be further configured such that when a component nearest the stop is removed, the additional component that was previously moved in the non-transport direction moves in the transport direction.

In another further embodiment of this component supply device, the at least one air inlet may be part of the guide. Similarly, the at least one air outlet may be part of the guide.

In another further embodiment of this component supply device, the cassette may include at least one additional air outlet.

The aforementioned object is accomplished with the method according to the invention in that the air outlet is closed by at least one component present in the row of components, once a predetermined number of components have been transported in the transport direction. Subsequently, at least one additional component following the row is transported in a non-transport direction such as a direction opposite to the transport direction. In addition, as the number of components that abut the component adjacent the stop is known in advance, the forces exerted on the component adjacent the stop are also known in advance.

The spacing between the stop and the most distal air outlet can be determined in advance. As a result, the number of components present between the stop and the air outlet can be set such that the components will not exert an undesirably large force on the components that are located near the stop.

According to embodiments of the present invention, further movement of the row in the direction of transport may take place automatically after the component nearest the stop is removed. Subsequently, the next component may then automatically be positioned into abutment with the stop and another component may be added to the row on a side of the row away from the stop.

As the air outlet may be closed by a particular component, components, which follow the row of components that includes the outlet-blocking component, can be prevented from being transported in the transport direction by means of air in a relatively simple manner.

These and other features, aspects, and advantages of the present invention will become more apparent from the following description, appended claims, and accompanying exemplary embodiments shown in the drawings.

DETAILED DESCRIPTION

Figure 1:
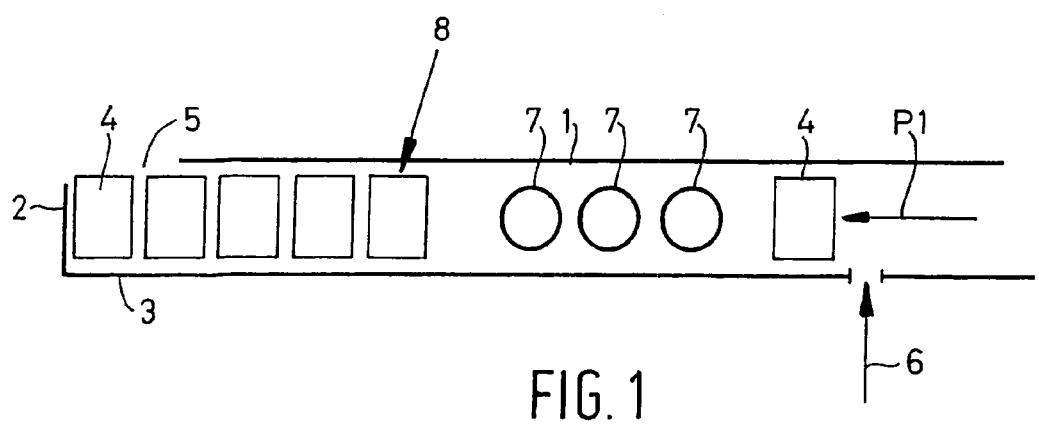
FIG. 1 is a sectional view of a guide of a component supplying device according to an embodiment of the present invention; air outlets of the guide are shown as being open.

Presently preferred embodiments of the invention are illustrated in the drawings. An effort has been made to use the same, or like, reference numbers throughout the drawings to refer to the same or like parts.

Figure 2:
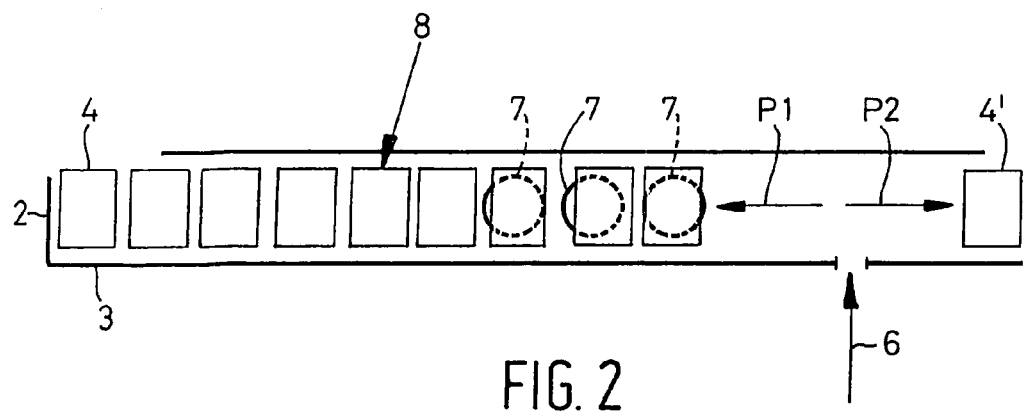
FIG. 2 is a sectional view of the guide of FIG. 1 with the air outlets shown as being closed.
Figure 3:
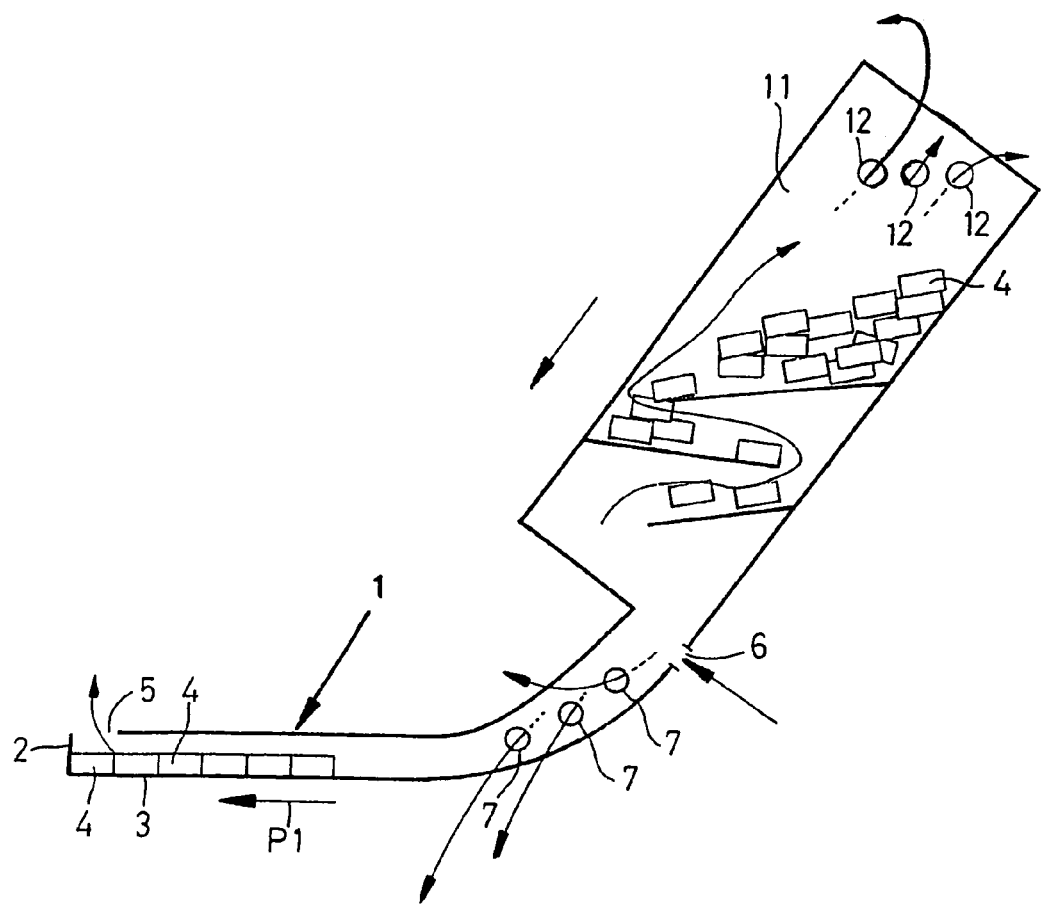
FIG. 3 is a sectional view of a component supplying device according to the invention provided with a guide of the type shown in FIGS. 1 and 2.

FIGS. 1-3 show a component supplying device according to the present invention. The component supplying device comprises a cassette 11 that contains components 4 and a tubular elongated guide 1 connected thereto. The guide 1 comprises a stop 2 at one end; a pickup position 3 is located near the stop 2. Components 4 may be picked-up from the pick-up position 3 through a recess 5 in the guide 1.

The guide 1 is provided with at least one air inlet 6 and at least one air outlet 7 located between the stop 2 and the air inlet 6. In some embodiments, multiple air inlets and/or multiple air outlets may be provided. For example, as shown there may be three air outlets 7. For reasons that will later become apparent, the dimensions of the air outlets 7 are smaller than those of the components 4.

Components 4 from the cassette 11 are introduced into the guide 1, for example under the influence of the force of gravity. Subsequently, the components 4 are moved in a transport direction, which is indicated by the arrow P1, towards the stop 2. Specifically, the components 3 are moved at least in part by means of air introduced via the air inlet 6. Once a first component 4 abuts against the stop 2, a next component 4 is positioned into abutment with the first component 4 and, as a result, a row 8 of components 4 is formed.

In the situation that is shown in FIG. 1, the air outlets 7 are open and the air that is introduced into the guide 1 via the air inlet 6 is discharged through the air outlets 7. In the situation that is shown in FIG. 2, the row 8 of components 4 is so long that the air outlets 7 are substantially closed by the components 4. The components 4 are configured to close the air outlets 7 (rather than be ejected therethrough) as a result of the components 4 having larger dimensions than the air outlets 7.

In the situation shown in FIG. 2, the air being supplied through the air inlet 6 can no longer be discharged via the substantially closed air outlets 7. As a result, a component 4' that was previously moving in the direction of the row 8 will move away from the row 8 in a non-transport direction P2. The non-transport direction P2 is directed back toward the cassette 11 and may be opposite the transport direction P1. Further, the air that is blown into the cassette 11 via the air inlet 6 exits the cassette 11 via additional air outlets 12 provided in the cassette 11. In this way the number of components present between component 4 that abuts against the stop 2 and the last component 4 of the row 8 will be consistently constant. Moreover, as a result of the limited number of components in the row 8, there will be no excessive pushing (or crushing) of components 4 against the stop 2.

As previously mentioned, the number of air inlets 6 and/or outlets 7 may vary. Moreover, the number of air inlets 6 and/or outlets 7 may depend on, among other factors, the amount of air that is required for a particular component transport. In the case of heavier components, more air is required than in the case of lighter components and, therefore, additional air inlets 6 and/or outlets 7 may be warranted for such heavier components.

Although the aforementioned describes embodiments of the invention, the invention is not so restricted. It will be apparent to those skilled in the art that various modifications and variations can be made to the disclosed embodiments of the present invention without departing from the scope or spirit of the invention. Accordingly, these other apparatuses and methods are fully within the scope of the claimed invention. Therefore, it should be understood that the apparatuses and methods described herein are illustrative only and are not limiting upon the scope of the invention, which is indicated by the following claims.

What is claimed is:

1. A method of supplying components, the method comprising the steps of:
   providing a component supplying device comprising:
      a guide including a component carrier and a stop adjacent a pick-up position;
      at least one air inlet in fluid communication with the component carrier; and
      at least one air outlet in fluid communication with the component carrier;
   supplying air to the component carrier by means of the at least one air inlet;
   moving a plurality of components via the component carrier in a transport direction toward the pick-up position by means of the air supplied to the guide;
   closing substantially at least one of the air outlets with one or more of the components moved in the transport direction toward the pick-up position; and then
   moving a component in the component carrier in a non-transport direction by means of the air supplied to the component carrier when a sufficient number of components have been moved by air in the transport direction.

2. The method according to claim 1, wherein the components are moved in the transport direction in a row, and wherein one of the air outlets is closed by the component at an end of the row away from the stop.

3. The method according to claim 1, further comprising the step of:
   removing the component nearest the stop.

4. The method according to claim 3, further comprising the step of:
   moving the remaining components in the transport direction toward the pick-up position such that at least one of the at least one air outlets is opened.

5. The method according to claim 4, further comprising the step of:
   moving, in the transport direction, by means of the air supplied to the guide the component that was previously moved in the non-transport direction.

6. A component supplying device comprising:
   a guide comprising:
      a stop adjacent a pick-up position; and
      a component carrier at least one air inlet in fluid communication with the component carrier; and at least one air outlet in fluid communication with the component carrier;

wherein the component supply device is configured such that: (a) when air is supplied to the component carrier by means of the at least one air inlet, the components move in a transport direction toward the pick-up position; (b) when a sufficient number of components have been moved by the air in the transport direction, at least one of the air outlets is substantially closed by the components, thereby forcing an additional component to be moved, in a non-transport direction, by air supplied to the component carrier by means of the at least one air inlet.

7. The component supply device according to claim 6, wherein the component supply device is further configured such that when a component nearest the stop is removed, the additional component that was previously moved in the non-transport direction moves in the transport direction.

8. The component supply device according to claim 6, wherein the at least one air inlet is part of the guide.

9. The component supply device according to claim 6, wherein the at least one air outlet is part of the guide.

10. The component supply device according to claim 9, wherein the at least one air inlet is part of the guide.

11. The component supply device according to claim 6, further comprising a component supply cassette.

12. The component supply device according to claim 11, wherein the cassette comprises at least one additional air outlet.

13. A method of supplying components, the method comprising:

providing a component supplying device comprising:
   a guide including a component carrier and a stop adjacent a pick-up position;
   at least one air inlet in fluid communication with the component carrier; and
   at least one air outlet in fluid communication with the component carrier;

supplying air to the component carrier via the at least one air inlet;

moving a plurality of components via the component carrier in a transport direction toward the pick-up position by the air supplied to the guide;

closing substantially at least one of the air outlets with one or more of the components moved in the transport direction toward the pick-up position, the at least one air outlet positioned closer to the pick-up position then at least one air inlet; and then moving a component in the component carrier in a non-transport direction by the air supplied to the component carrier when a sufficient number of components have been moved by air in the transport direction.

14. The method according to claim 13, wherein the components are moved in the transport direction in a row, and wherein one of the air outlets is closed by the component at an end of the row away from the stop.

15. The method according to claim 13, further comprising:

removing the component nearest the stop.

16. The method according to claim 15, further comprising:

moving the remaining components in the transport direction toward the pick-up position such that at least one of the at least one air outlets is opened.

17. The method according to claim 16, further comprising:

moving, in the transport direction, by the air supplied to the guide the component that was previously moved in the non-transport direction.

\* \* \* \* \*